(12) United States Patent
Nakae et al.

(10) Patent No.: US 11,252,837 B2
(45) Date of Patent: Feb. 15, 2022

(54) COOLING APPARATUS

(71) Applicant: Nidec Corporation, Kyoto (JP)

(72) Inventors: Nobuya Nakae, Kyoto (JP); Akihiko Makita, Kyoto (JP); Hidenobu Takeshita, Kyoto (JP); Tomotsugu Sugiyama, Kyoto (JP); Toshihiko Tokeshi, Kyoto (JP); Takehito Tamaoka, Kyoto (JP)

(73) Assignee: NIDEC CORPORATION, Kyoto (JP)

(*) Notice: Subject to any disclaimer, the term of this patent is extended or adjusted under 35 U.S.C. 154(b) by 31 days.

(21) Appl. No.: 16/297,770

(22) Filed: Mar. 11, 2019

(65) Prior Publication Data

US 2019/0307019 A1    Oct. 3, 2019

(30) Foreign Application Priority Data

Mar. 30, 2018 (JP) .............................. JP2018-067978
Dec. 28, 2018 (JP) .............................. JP2018-248653

(51) Int. Cl.
*H05K 7/20* (2006.01)
*F28D 1/053* (2006.01)
*F28F 1/02* (2006.01)

(52) U.S. Cl.
CPC ..... *H05K 7/20254* (2013.01); *F28D 1/05383* (2013.01); *F28F 1/022* (2013.01); *H05K 7/20272* (2013.01); *H05K 7/20409* (2013.01); *H05K 7/20509* (2013.01)

(58) Field of Classification Search
CPC ....... H01L 23/40; H01L 23/46; H01L 23/473; H01L 23/3672; H01L 23/467; H01L 23/4735; H05K 7/20; H05K 7/20272; H05K 7/20263; H05K 7/20254; H05K 7/20409; H05K 7/202509; F28D 1/05375; F28D 1/05383; F28D 1/05366; F28D 2021/0031; F28D 2021/0029; F28F 2250/08; F28F 1/02; F28F 1/022
See application file for complete search history.

(56) References Cited

U.S. PATENT DOCUMENTS

| 6,749,012 | B2 | 6/2004 | Gwin et al. |
| 7,325,591 | B2 | 2/2008 | Duan et al. |
| 10,048,008 | B1* | 8/2018 | Mounioloux ....... F28D 1/05391 |
| 10,917,995 | B2* | 2/2021 | Tokeshi ................ H01L 23/473 |

(Continued)

FOREIGN PATENT DOCUMENTS

JP    2004-304076 A    10/2004

OTHER PUBLICATIONS

Nakae et al., "Cooling Apparatus", U.S. Appl. No. 16/297,769, filed Mar. 11, 2019.

*Primary Examiner* — Len Tran
*Assistant Examiner* — Jenna M Hopkins
(74) *Attorney, Agent, or Firm* — Keating & Bennett

(57) ABSTRACT

A cooling apparatus includes a cold plate including a lower surface to be in contact with a heat-radiating component, and a first coolant passage in which a coolant flows, a radiator including fins to perform cooling and pipes each defining a second coolant passage in communication with the first coolant passage, a pump to circulate the coolant, a first tank joined to one end of each of the pipes, and a second tank to join another end of each of the pipes to the pump. The radiator is provided on the cold plate, and the pump is adjacent to the second tank.

11 Claims, 12 Drawing Sheets

(56) References Cited

U.S. PATENT DOCUMENTS

| | | | |
|---|---|---|---|
| 10,959,353 B2* | 3/2021 | Tokeshi | H05K 7/20272 |
| 11,109,510 B2* | 8/2021 | Nakae | F28F 1/325 |
| 2004/0190250 A1 | 9/2004 | Iijima et al. | |
| 2006/0185378 A1 | 8/2006 | Duan et al. | |
| 2007/0023167 A1* | 2/2007 | Liu | H01L 23/473 |
| | | | 165/80.4 |
| 2007/0034353 A1* | 2/2007 | Liu | H01L 23/473 |
| | | | 165/80.4 |
| 2007/0034359 A1* | 2/2007 | Liu | F28D 1/05366 |
| | | | 165/104.31 |
| 2007/0103869 A1* | 5/2007 | Liu | H01L 23/473 |
| | | | 361/699 |
| 2007/0110559 A1* | 5/2007 | Liu | F04D 29/588 |
| | | | 415/90 |
| 2008/0128114 A1* | 6/2008 | Lai | H01L 23/473 |
| | | | 165/80.4 |
| 2008/0169086 A1* | 7/2008 | Hu | H01L 23/473 |
| | | | 165/80.4 |
| 2008/0179041 A1* | 7/2008 | Hu | H01L 23/473 |
| | | | 165/71 |
| 2009/0044929 A1* | 2/2009 | Yeh | H01L 23/473 |
| | | | 165/104.19 |
| 2009/0090489 A1* | 4/2009 | Chiang | H05K 7/20254 |
| | | | 165/104.33 |
| 2011/0272120 A1* | 11/2011 | Joshi | F28D 1/05366 |
| | | | 165/104.13 |
| 2013/0299139 A1* | 11/2013 | Mounioloux | G06F 1/20 |
| | | | 165/120 |
| 2016/0136851 A1* | 5/2016 | Campbell | H05K 7/20436 |
| | | | 264/279 |
| 2016/0234968 A1* | 8/2016 | Huang | G06F 1/20 |
| 2016/0242320 A1* | 8/2016 | Agostini | F28D 15/0266 |
| 2016/0330868 A1* | 11/2016 | Sun | H05K 7/20336 |
| 2016/0341488 A1* | 11/2016 | Wan | H01L 23/427 |
| 2016/0366788 A1* | 12/2016 | Liao | H05K 7/20272 |
| 2017/0014929 A1* | 1/2017 | So | B23K 35/025 |
| 2017/0023317 A1* | 1/2017 | Zhang | F28F 3/12 |
| 2017/0045306 A1* | 2/2017 | Tsai | H01L 23/473 |
| 2017/0045307 A1* | 2/2017 | Tsai | H01L 23/467 |
| 2017/0055370 A1* | 2/2017 | Tsai | H05K 7/20272 |
| 2017/0105312 A1* | 4/2017 | Tsai | G06F 1/20 |
| 2017/0115708 A1* | 4/2017 | Tivadar | G06F 1/20 |
| 2017/0212560 A1* | 7/2017 | Tsai | H05K 7/20272 |
| 2017/0367216 A1* | 12/2017 | Shen | H05K 7/20272 |
| 2017/0367217 A1* | 12/2017 | Xiao | H01L 23/473 |
| 2018/0023594 A1* | 1/2018 | Sheng | F04D 1/06 |
| | | | 165/104.31 |
| 2018/0063993 A1* | 3/2018 | Wu | H05K 7/20272 |
| 2018/0092247 A1* | 3/2018 | Chiu | F28F 9/0221 |
| 2018/0092249 A1* | 3/2018 | Chiu | F28F 1/28 |
| 2018/0132386 A1* | 5/2018 | Tung | F28F 1/126 |
| 2018/0172355 A1* | 6/2018 | Takase | F28F 9/26 |
| 2018/0195804 A1* | 7/2018 | Mai | F28F 23/02 |
| 2018/0228040 A1* | 8/2018 | Lykke | F28F 13/12 |
| 2018/0269131 A1* | 9/2018 | Na | H05K 7/20263 |
| 2018/0308786 A1* | 10/2018 | Huang | F28D 1/0535 |
| 2018/0340736 A1* | 11/2018 | Mounioloux | F28D 1/05341 |
| 2019/0041144 A1* | 2/2019 | Wan | H05K 7/20309 |
| 2019/0053403 A1* | 2/2019 | Lin | H05K 7/20327 |
| 2019/0056179 A1* | 2/2019 | Chialastri | F28D 15/0208 |
| 2019/0069444 A1* | 2/2019 | Wan | H05K 7/20309 |
| 2019/0090384 A1* | 3/2019 | Xiao | H05K 7/20272 |
| 2019/0128623 A1* | 5/2019 | Maeyama | F28D 1/05383 |
| 2019/0166720 A1* | 5/2019 | Takemura | H05K 7/20254 |
| 2019/0174653 A1* | 6/2019 | Fan | H05K 7/20272 |
| 2019/0239388 A1* | 8/2019 | Tsai | H05K 7/20254 |
| 2019/0307019 A1* | 10/2019 | Nakae | F28F 1/022 |
| 2020/0084913 A1* | 3/2020 | Jia | F28F 3/022 |
| 2020/0116430 A1* | 4/2020 | Nakae | F28D 1/0246 |
| 2020/0146181 A1* | 5/2020 | Tokeshi | H01L 23/473 |

* cited by examiner

US 11,252,837 B2

COOLING APPARATUS

CROSS REFERENCE TO RELATED APPLICATIONS

This application claims the benefit of priority to Japanese Patent Application No. 2018-067978 filed on Mar. 30, 2018 and Japanese Patent Application No. 2018-248653 filed on Dec. 28, 2018. The entire contents of these applications are hereby incorporated herein by reference.

BACKGROUND OF THE INVENTION

1. Field of the Invention

The present disclosure relates to a cooling apparatus.

2. Description of the Related Art

A known cooling apparatus typically includes a heat sink, a radiator, and an electric pump. The heat sink typically includes an electronic component-mounting surface on which an electronic component to be cooled is mounted, and a coolant passage in which a liquid flows as a coolant. The radiator typically includes a liquid passage in which a coolant flows, and the liquid passage is typically air-cooled to cool the coolant. The electric pump is typically arranged to give energy for transfer to the coolant to cause the coolant to circulate between the heat sink and the radiator.

However, in such a known cooling apparatus, the heat sink, the radiator, and the electric pump are typically connected to one another through a pipe, and this may result in an excessive size of the cooling apparatus as a whole.

SUMMARY OF THE INVENTION

A cooling apparatus according to an example embodiment of the present disclosure includes a cold plate, a radiator, a pump, a first tank, and a second tank. The cold plate includes a lower surface to be in contact with a heat-radiating component, and a first coolant passage in which a coolant flows. The radiator includes fins to perform cooling, and a plurality of pipes defining a second coolant passage in communication with the first coolant passage. The pump circulates the coolant. The first tank is joined to one end of each of the pipes. The second tank joins another end of each of the pipes to the pump. The radiator is provided on the cold plate, and the pump is adjacent to the second tank.

The above and other elements, features, steps, characteristics and advantages of the present disclosure will become more apparent from the following detailed description of the example embodiments with reference to the attached drawings.

BRIEF DESCRIPTION OF THE DRAWINGS

FIG. 12 is a vertical sectional view illustrating a discharge outlet of a cooling apparatus according to a modification of the third example embodiment of the present disclosure.

DETAILED DESCRIPTION OF THE PREFERRED EMBODIMENTS

Hereinafter, example embodiments of the present disclosure will be described with reference to the accompanying drawings. It is assumed herein that a side of a cold plate 10 on which a radiator 20 is arranged is referred to as an upper side, while an opposite side of the cold plate 10 with respect to the radiator 20 is referred to as a lower side. It is also assumed herein that the radiator 20 and the cold plate 10 are arranged one above the other in a vertical direction, and that a direction perpendicular to the vertical direction is referred to as a horizontal direction. The shape of each member or portion and relative positions of different members or portions will be described based on the above assumptions. Note, however, that the above definitions of the vertical direction, the upper and lower sides, and the horizontal direction are simply made for the sake of convenience in description, and should not be construed to restrict the orientation of a cooling apparatus 1 according to any preferred embodiment of the present disclosure at the time of manufacture or when in use.

Also note that the term "parallel" as used herein includes both "parallel" and "substantially parallel". Also note that the term "perpendicular" as used herein includes both "perpendicular" and "substantially perpendicular".

Figure 1:
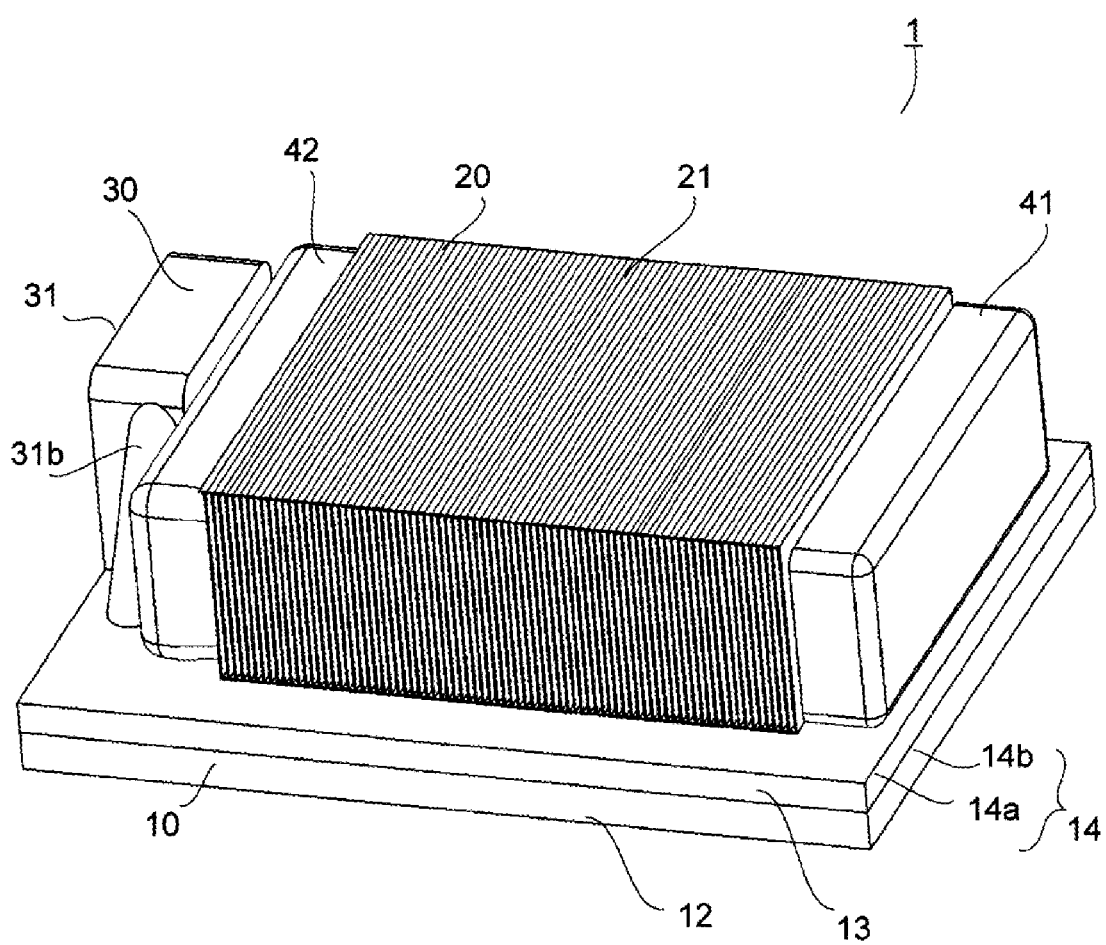
FIG. 1 is a perspective view of a cooling apparatus according to a first example embodiment of the present disclosure.
Figure 2:
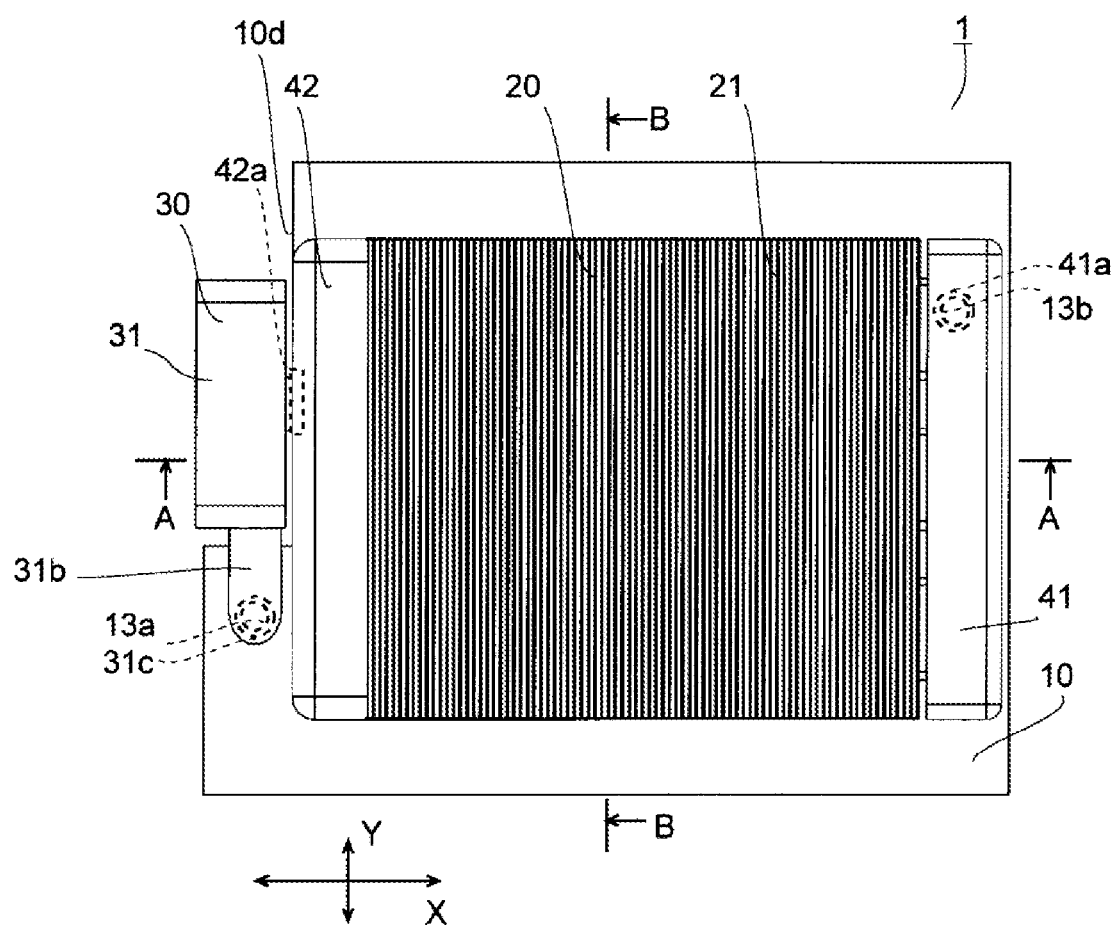
FIG. 2 is a top view of the cooling apparatus according to the first example embodiment of the present disclosure.
Figure 3:
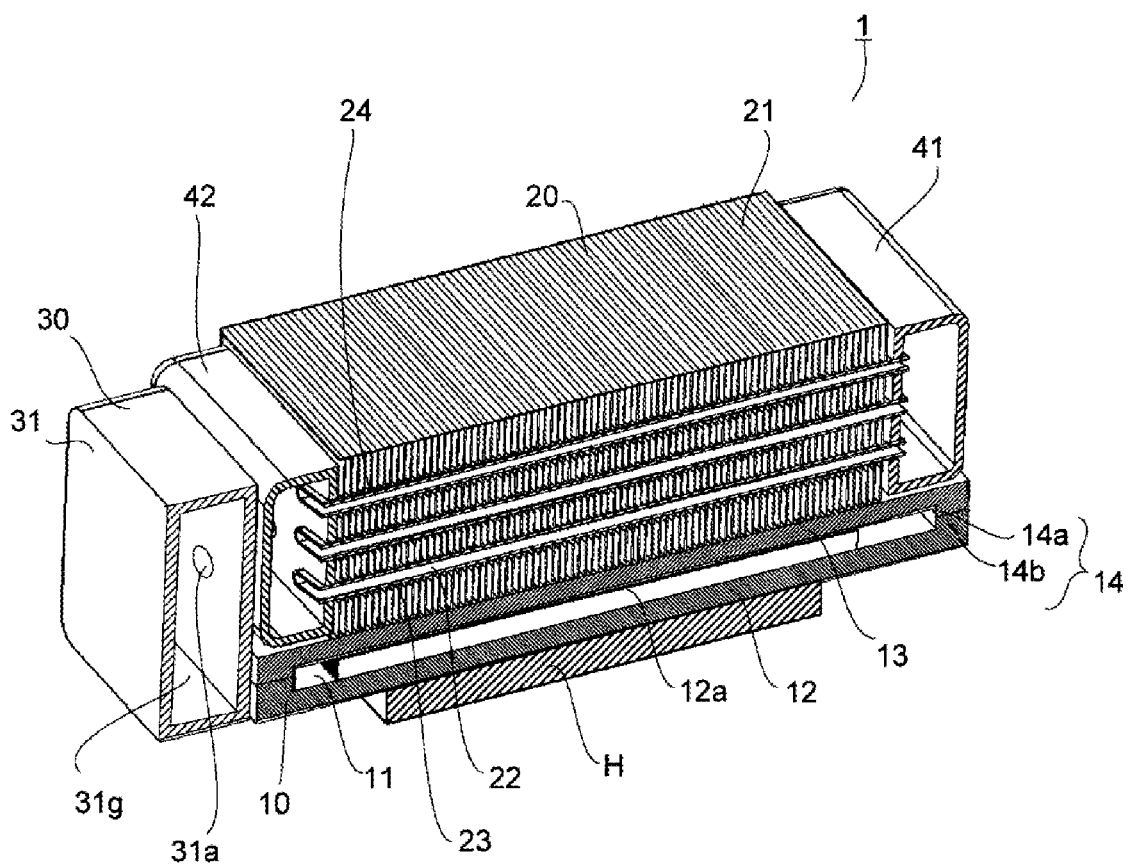
FIG. 3 is a perspective sectional view of the cooling apparatus taken along line A-A in FIG. 2.
Figure 4:
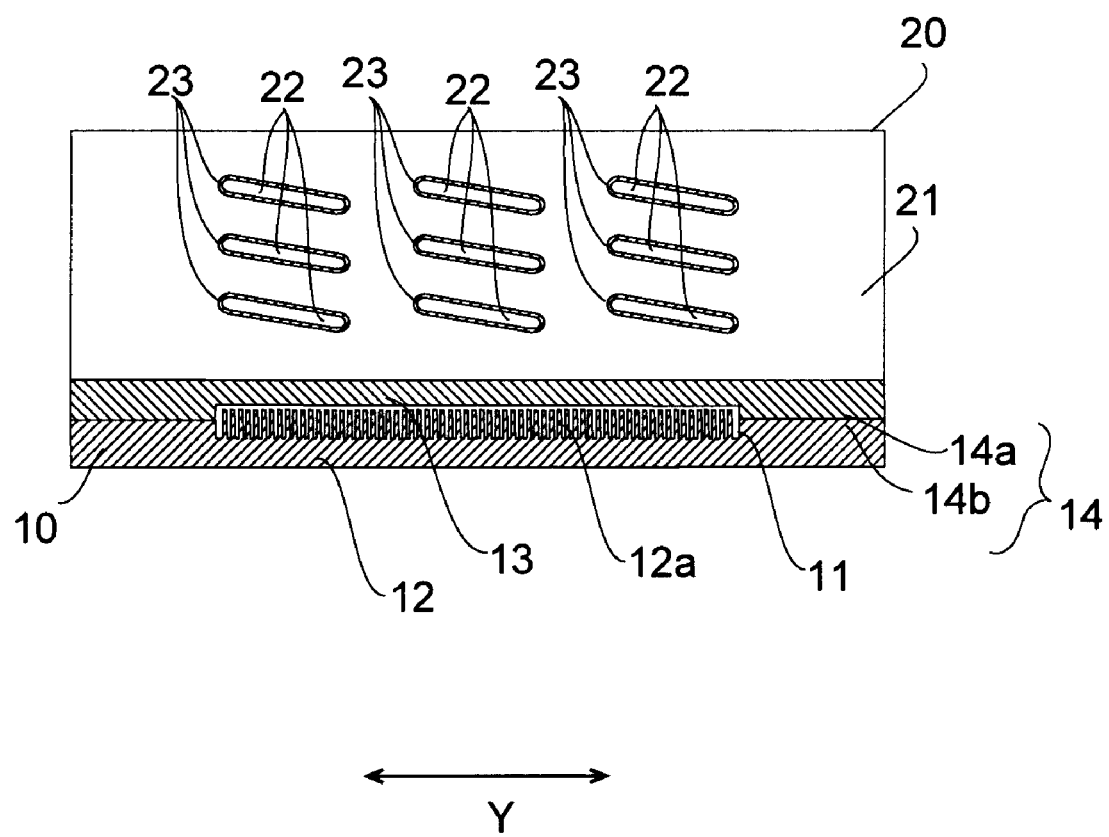
FIG. 4 is a sectional view of the cooling apparatus taken along line B-B in FIG. 2.

A cooling apparatus according to a preferred embodiment of the present disclosure will now be described below. FIGS. 1 and 2 are a perspective view and a top view, respectively, of a cooling apparatus 1 according to a preferred embodiment of the present disclosure. FIG. 3 is a perspective sectional view of the cooling apparatus 1 taken along line A-A in FIG. 2. FIG. 4 is a sectional view of the cooling apparatus 1 taken along line B-B in FIG. 2.

The cooling apparatus 1 includes a cold plate 10, a radiator 20, a first tank 41, a second tank 42, and a pump 30. Each of the radiator 20, the first tank 41, and the second tank 42 is arranged on the cold plate 10. A lower surface of each of the radiator 20, the first tank 41, and the second tank 42 is arranged to be in contact with an upper surface of the cold plate 10. In addition, the pump 30 is arranged adjacent to the second tank 42. Thus, a reduction in the size of the cooling apparatus 1 as a whole is achieved with the cold plate 10, the radiator 20, the pump 30, the first tank 41, and the second tank 42 being combined into a single unit.

The cold plate 10, the radiator 20, and the pump 30 are, for example, directly connected to one another, eliminating the need for members, such as, for example, pipes, to join the cold plate 10, the radiator 20, and the pump 30 to one another. This leads to an additional reduction in the size of the cooling apparatus 1. This in turn makes it easier to attach the cooling apparatus 1 to a device. Note that the cold plate 10, the radiator 20, and the pump 30 may alternatively be coupled to one another through, for example, a pipe having a reduced length over the cold plate 10.

The cold plate 10 is made of a metal having a high thermal conductivity, such as, for example, copper or aluminum, and includes a bottom wall portion 12, an upper wall portion 13, and a side wall portion 14. In the present preferred embodiment, the cold plate 10 is rectangular in a plan view. That is, each of the bottom wall portion 12 and the upper wall portion 13 is in the shape of a plate extending horizontally in a plan view. Note that, although each of the bottom wall portion 12 and the upper wall portion 13 according to the present preferred embodiment is in the shape of a quadrilateral in a plan view, each of the bottom wall portion 12 and the upper wall portion 13 may alternatively be in the shape of, for example, another polygon having a plurality of angles or a circle in a plan view. A heat-radiating component H is arranged to be in contact with a lower surface of the bottom wall portion 12.

The side wall portion 14 is arranged to join outer edges of the bottom wall portion 12 and the upper wall portion 13. That is, the cold plate 10 includes the plate-shaped bottom wall portion 12, the upper wall portion 13, which is arranged to cover an upper surface of the bottom wall portion 12, and the side wall portion 14, which is arranged to join the outer edges of the bottom wall portion 12 and the upper wall portion 13. The side wall portion 14 includes a first side wall portion 14a arranged to extend upward from the outer edge of the bottom wall portion 12, and a second side wall portion 14b arranged to extend downward from the outer edge of the upper wall portion 13. An upper surface of the first side wall portion 14a and a lower surface of the second side wall portion 14b are joined to each other.

Referring to FIG. 3, the cold plate 10 includes a first coolant passage 11 in which a coolant flows. The first coolant passage 11 is defined in an interior space enclosed by the bottom wall portion 12, the upper wall portion 13, and the side wall portion 14. In addition, a plurality of blades 12a are arranged in parallel in the first coolant passage 11. In addition, the upper wall portion 13 includes an inflow port 13a and an outflow port 13b each of which is arranged to pass through a portion of the upper wall portion 13 in the vertical direction. The coolant flows into the first coolant passage 11 through the inflow port 13a, and flows out of the first coolant passage 11 through the outflow port 13b.

The first coolant passage 11 is defined in the interior space enclosed by the bottom wall portion 12, the upper wall portion 13, and the side wall portion 14. In the present preferred embodiment, the coolant is a liquid, and examples of the coolant that can be used include pure water and an antifreeze solution, such as, for example, an aqueous solution of ethylene glycol or an aqueous solution of propylene glycol.

The radiator 20 includes a plurality of fins 21 used for cooling, and a plurality of pipes 23. Each fin 21 is in the shape of a flat plate, and is arranged to extend upward from an upper surface of the upper wall portion 13 and in a horizontal direction on the cold plate 10. In the present preferred embodiment, the cold plate 10 has a longitudinal direction X and a widthwise direction Y, and each of the fins 21 is arranged to extend in the widthwise direction Y. In addition, the fins 21 are arranged in parallel and at regular intervals in the longitudinal direction X of the cold plate 10.

A lower end of each fin 21 is arranged to be in contact with the upper surface of the upper wall portion 13. This arrangement promotes heat transfer from the upper wall portion 13 to the fin 21. Note that the fins 21 and the upper wall portion 13 may be defined either by separate members or by a single monolithic member. In the present preferred embodiment, the fins 21 and the upper wall portion 13 are defined by separate members. The lower end of each fin 21 is joined to the upper surface of the upper wall portion 13 through welding, for example.

In the case where the fins 21 and the upper wall portion 13 are defined by a single monolithic member, the fins 21 are defined by, for example, performing a cutting process on the upper surface of the upper wall portion 13. Note that, in the case where the fins 21 and the upper wall portion 13 are defined by separate members, it is preferable that the fins 21 are made of a metal having a high thermal conductivity, such as, for example, copper or aluminum, as is the above-described cold plate 10. Heat can be efficiently transferred from the cold plate 10 to the fins 21 when the fins 21 are made of a metal having a high thermal conductivity as is the cold plate 10.

Each pipe 23 is hollow, and is arranged to define a second coolant passage 22 in which the coolant passes. The second coolant passage 22 is arranged to be in communication with the first coolant passage 11. More specifically, the second coolant passage 22 is arranged to be in communication with the first coolant passage 11 through the pump 30, the first tank 41, and the second tank 42.

Each pipe 23 is arranged to extend in a straight line in the longitudinal direction X of the cold plate 10. The pipe 23 is inserted through "through holes" 24 defined in the fins 21, and is fixed to the fins 21 through welding. Here, a direction in which each pipe 23 extends and a direction in which each fin 21 extends are perpendicular to each other. That is, in the present preferred embodiment, each of the fins 21 is arranged to extend in the widthwise direction Y, while each of the pipes 23 is arranged to extend in the longitudinal direction X. Note that each of the fins 21 and the pipes 23 may alternatively be arranged to extend in any other desired direction, and that, for example, each pipe 23 may be arranged to extend at an angle to the direction in which the fins 21 are arranged.

One end of each pipe 23 is joined to the first tank 41, while another end of the pipe 23 is joined to the second tank 42. The first tank 41 and the second tank 42 are arranged opposite to each other in the direction in which each pipe 23 extends. Thus, the coolant smoothly flows in a straight line from the first tank 41 to the second tank 42 through each pipe 23.

The first tank 41 and the second tank 42 are arranged in parallel with the direction in which each fin 21 extends, and this contributes to increasing the number of fins 21 that can be arranged at specified intervals between the first tank 41 and the second tank 42. Thus, an improvement in cooling performance of the radiator 20 can be achieved through an increase in the combined surface area of the fins 21. In addition, each pipe 23 can be easily connected to the first tank 41 and the second tank 42.

Each pipe 23 is arranged to pass through a side surface of each of the first tank 41 and the second tank 42, and is thus directly joined to each of the first tank 41 and the second tank 42 (see FIG. 3). This leads to a reduction in the number of parts of the cooling apparatus 1, and to an increase in the dimension of each pipe 23 measured in the longitudinal direction X, which in turn increases efficiency with which the coolant is cooled.

The pipes 23 are arranged in three rows and three columns. Thus, a total of nine pipes 23 are connected in parallel through the first tank 41 and the second tank 42 (see FIG. 4). Thus, heat is transferred from each pipe 23 to the fins 21 to efficiently cool the coolant, while an excessive increase in the size of the cooling apparatus 1 is prevented. Note that the number of pipes 23 is not limited to nine, and may alternatively be less than nine, or more than nine. Also note that the pipes 23 may or may not be arranged at regular intervals.

Each of the first tank 41 and the second tank 42 is in the shape of a rectangular parallelepiped, and a lower surface of the first tank 41 includes a through hole 41a defined therein. The through hole 41a is connected to the outflow port 13b of the upper wall portion 13, with the through hole 41a coinciding or overlapping with the outflow port 13b when viewed in the vertical direction (see FIG. 2). In addition, the second tank 42 includes a through hole 42a defined in a surface thereof which is opposite to the surface thereof to which each pipe 23 is joined (see FIG. 2). The through hole 42a is connected to a suction inlet 31a, which will be described below, of the pump 30 (see FIG. 3).

For example, the pump 30 according to the present preferred embodiment is a centrifugal pump, and includes a casing 31 in the shape of a rectangular parallelepiped, and a passage 31g for the coolant defined inside of the casing 31. An impeller (not shown) is arranged in the passage 31g. One of adjacent side surfaces of the casing 31 has the suction inlet 31a defined therein, and another one of the adjacent side surfaces has a discharge outlet 31b. The discharge outlet 31b is arranged to project outward from the side surface of the casing 31 and extend downward with increasing distance from the casing 31. The discharge outlet 31b is connected to the inflow port 13a of the upper wall portion 13 (see FIG. 2).

The impeller of the pump 30 is supported to be rotatable about a central axis extending in a horizontal direction (i.e., the direction in which the coolant flows in the second coolant passage), and is joined to a rotating shaft of a motor (not shown). The impeller is caused to rotate by driving of the motor, so that the coolant, coming in through the suction inlet 31a, is discharged through the discharge outlet 31b.

The pump 30 is arranged to suck the coolant in the direction in which each pipe 23 extends through the suction inlet 31a. Thus, the coolant, flowing into the second tank 42 from each pipe 23, smoothly flows into the suction inlet 31a. This leads to a smooth flow of the coolant, and a reduced power consumption of the pump 30.

The pump 30 is arranged adjacent to the second tank 42. Thus, a reduction in the size of the cooling apparatus 1 as a whole is achieved with the cold plate 10, the radiator 20, the pump 30, the first tank 41, and the second tank 42 being combined into a single unit. Further, the cold plate 10, the radiator 20, and the pump 30 are directly connected to one another, eliminating the need for members, such as, for example, pipes, to join the cold plate 10, the radiator 20, and the pump 30 to one another. This makes it easier to attach the cooling apparatus 1 to a device including the heat-radiating component.

The cold plate 10 includes a cut portion 10d defined by a bend of a short-side side surface thereof. At least a portion of the pump 30 is arranged at the cut portion 10d and opposite to the side surface of the cold plate 10. Thus, an additional reduction in the size of the cooling apparatus 1 as a whole can be achieved. In addition, increases in the size and power of the pump 30 can be achieved despite a limited space for the cooling apparatus 1, while an increase in the size of the cooling apparatus 1 as a whole is minimized.

A lower end of the pump 30 is arranged at a level higher than that of a lower surface of the cold plate 10. This prevents a gap from being defined between the cold plate 10 and the heat-radiating component H due to a contact of the lower end of the pump 30 with a mounting surface of the heat-radiating component H when the heat-radiating component H is brought into contact with the lower surface of the cold plate 10.

Figure 5:
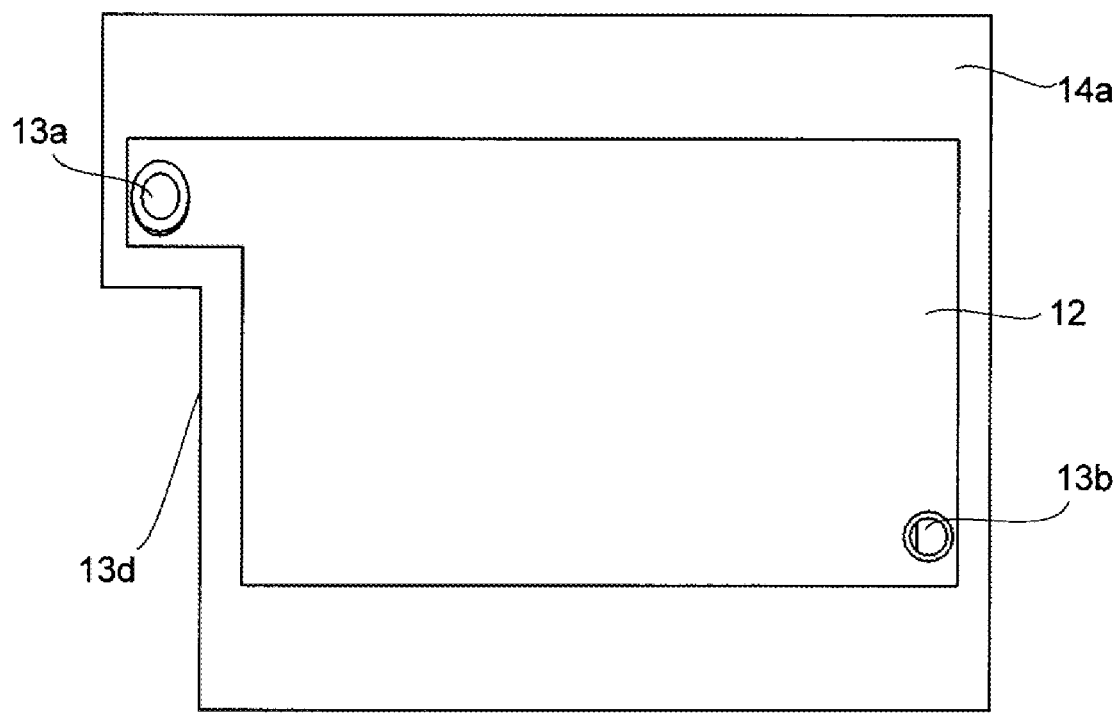
FIG. 5 is a bottom view of an upper wall portion of a cold plate of the cooling apparatus according to the first example embodiment of the present disclosure.
Figure 6:
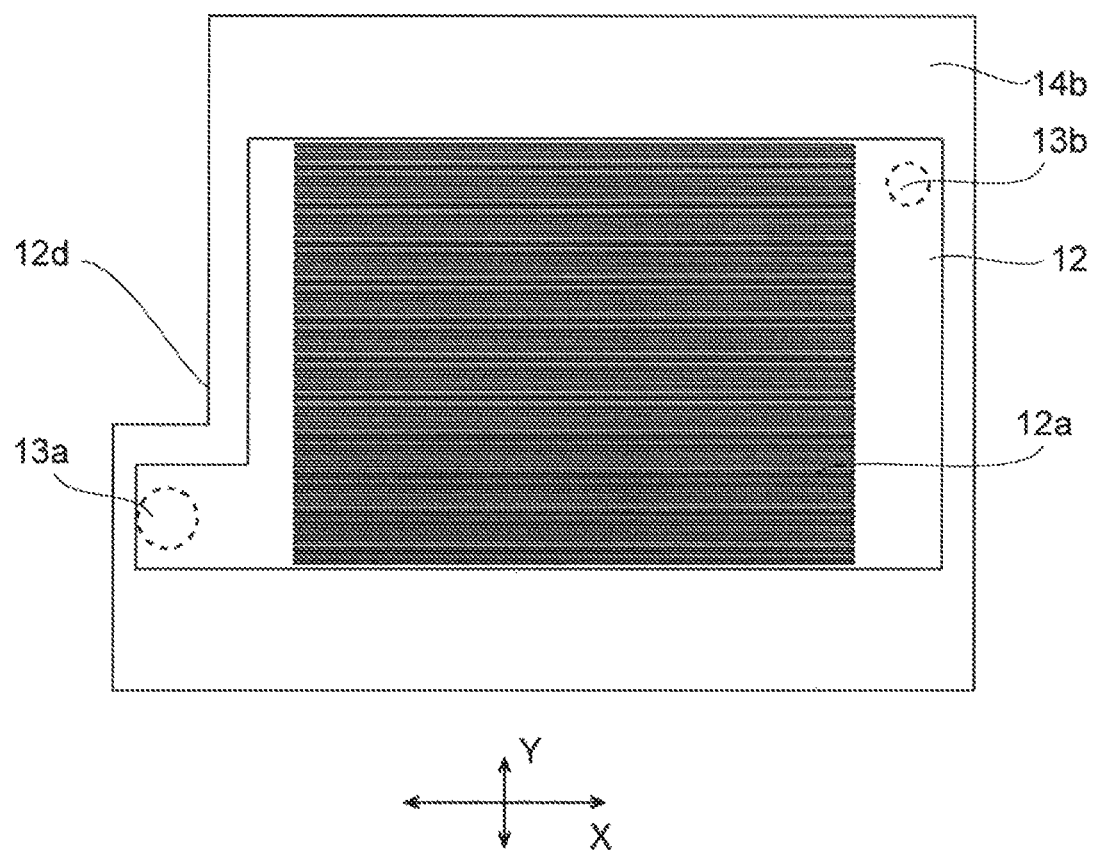
FIG. 6 is a top view of a bottom wall portion of the cold plate of the cooling apparatus according to the first example embodiment of the present disclosure.

FIG. 5 is a bottom view of the upper wall portion 13, and FIG. 6 is a top view of the bottom wall portion 12. In FIG. 6, each of the inflow port 13a and the outflow port 13b, which are defined in the upper wall portion 13, is represented by a broken line. The upper wall portion 13 includes an upper wall cut portion 13d defined by a bend of a short-side side surface thereof, and the bottom wall portion 12 includes a bottom wall cut portion 12d defined by a bend of a short-side side surface thereof.

The cut portion 10d of the cold plate 10 is defined by the upper wall cut portion 13d and the bottom wall cut portion 12d. That is, at least a portion of the pump 30 is arranged at the upper wall cut portion 13d and the bottom wall cut portion 12d and opposite to the side surface of the cold plate 10.

In addition, a short-side side surface of the first coolant passage 11 is also bent. The inflow port 13a and the outflow port 13b are arranged diagonally opposite to each other at the first coolant passage 11. This enables the coolant to flow all over the first coolant passage 11.

Referring to FIG. 6, the blades 12a are arranged on the upper surface of the bottom wall portion 12. In the present preferred embodiment, the blades 12a are arranged in the first coolant passage 11. The blades 12a are arranged in parallel and at regular intervals in the widthwise direction Y, and each blade 12a is arranged to extend in the longitudinal direction X of the cold plate 10. A vertical gap is defined between an upper end of each blade 12a and a lower surface of the upper wall portion 13 (see FIG. 4). In addition, the bottom wall portion 12 includes a region in which the blades 12a are not arranged under each of the inflow port 13a and the outflow port 13b (see FIG. 6).

The coolant, flowing into the first coolant passage 11 through the inflow port 13a, spreads in the widthwise direction Y on the bottom wall portion 12, and flows between the blades 12a. The coolant, flowing between the blades 12a, spreads throughout the first coolant passage 11, and flows out through the outflow port 13b. Thus, the entire lower surface of the cold plate 10 is cooled by the coolant.

The heat-radiating component H is arranged to be in contact with the lower surface of the bottom wall portion 12 (see FIG. 3). Here, it is preferable that the heat-radiating component H is arranged on a portion of the lower surface of the bottom wall portion 12 which is opposite to the first coolant passage 11 in the vertical direction. When the heat-radiating component H and the first coolant passage 11 are arranged opposite to each other in the vertical direction, heat generated from the heat-radiating component H can be efficiently transferred to the coolant flowing in the first coolant passage 11.

In addition, it is more preferable that the heat-radiating component H is arranged under a region in which the blades 12a are arranged. More specifically, the heat-radiating component H is preferably arranged within the extent of the blades 12a in the longitudinal direction X, in which each blade 12a is arranged to extend, and within the extent of the blades 12a in the widthwise direction Y, in which the blades 12a are arranged. When the heat-radiating component H is arranged under the above region, the heat-radiating component H can be cooled with increased efficiency.

Further, it is more preferable that the heat-radiating component H is arranged to overlap with a line joining the inflow port 13a and the outflow port 13b. The coolant, which circulates in the cooling apparatus 1, is cooled by the radiator 20 at and near the line joining the inflow port 13a and the outflow port 13b. Thus, when the heat-radiating component H is arranged to overlap with this line, the heat-radiating component H can be cooled with increased efficiency.

Figure 7:
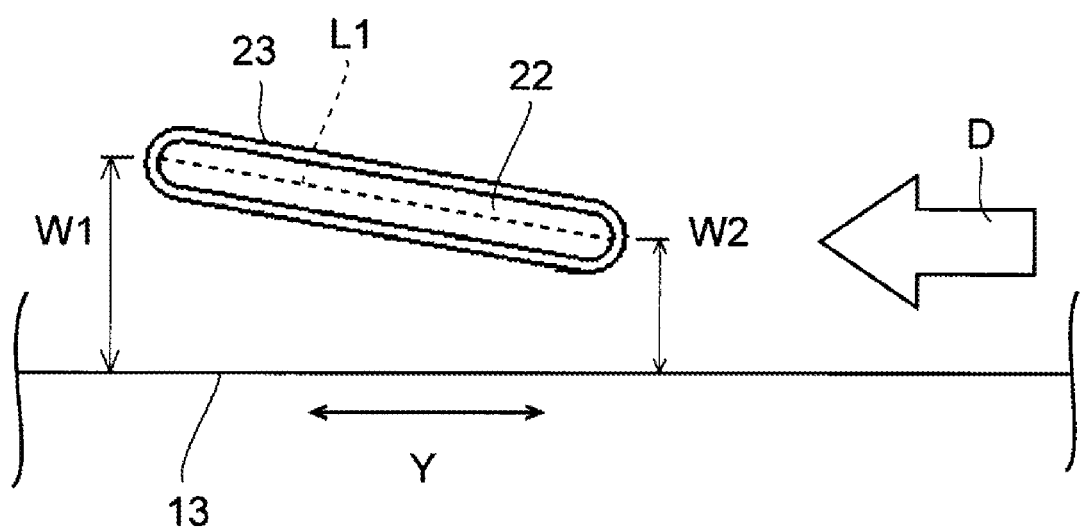
FIG. 7 is a vertical sectional view of a pipe of the cooling apparatus according to the first example embodiment of the present disclosure shown in an enlarged form.

FIG. 7 is a vertical sectional view of the pipe 23 shown in an enlarged form. The pipe 23 is arranged to have a flat section, and a distance W1 between the upper surface of the upper wall portion 13 and one end of a major axis L1 of the section of the pipe 23 is different from a distance W2 between the upper surface of the upper wall portion 13 and another end of the major axis L1. Cooling air may be sent in a direction indicated by an arrow D from the side on which the distance between the upper surface of the upper wall portion 13 and the major axis L1 of the pipe 23 is shorter toward the side on which this distance is longer, and this will lead to an increase in the total area of a surface of the pipe 23 with which the cooling air makes direct contact. In addition, a smooth flow of the cooling air along the pipe 23 can thus be achieved. Thus, an additional improvement in the cooling performance of the radiator 20 is achieved.

The major axis L1 of the pipe 23 is preferably inclined at an angle of 5 degrees to 15 degrees both inclusive with respect to the upper surface of the cold plate 10. If the inclination angle of the major axis L1 of the pipe 23 were less than 5 degrees, the total area of the surface of the pipe 23 with which the cooling air makes direct contact would be small, making it difficult to improve the cooling performance of the radiator 20. On the other hand, if the inclination angle of the major axis L1 of the pipe 23 were more than 15 degrees, the pipe 23 would hinder the flow of the cooling air, reducing the cooling performance of the radiator 20. Further, the cooling performance of the radiator 20 is maximized when the major axis L1 of the pipe 23 is inclined at an angle of 10 degrees with respect to the upper surface of the cold plate 10.

The pump 30 is driven with the heat-radiating component, such as, for example, a CPU, which is to be cooled, being in contact with the lower surface of the bottom wall portion 12 of the cold plate 10. As a result, the coolant is caused to circulate, flowing from the first coolant passage 11 back to the first coolant passage 11 through the first tank 41, the second coolant passages 22, and the second tank 42 in the order named. Heat generated by the heat-radiating component is transferred to the bottom wall portion 12 of the cold plate 10. The heat transferred to the bottom wall portion 12 is transferred to the fins 21 through the upper wall portion 13, and, in addition, is transferred to the fins 21 through the coolant flowing through the first coolant passage 11 and the second coolant passages 22. The heat is thus dissipated through the fins 21, reducing an increase in the temperature of the heat-radiating component.

The heat dissipation through the fins 21 can be promoted by cooling air being sent from a cooling fan (not shown) arranged on a lateral side of the radiator 20 in the direction (i.e., the widthwise direction Y) in which each fin 21 extends, so that an additional improvement in the cooling performance of the radiator 20 can be achieved.

Figure 8:
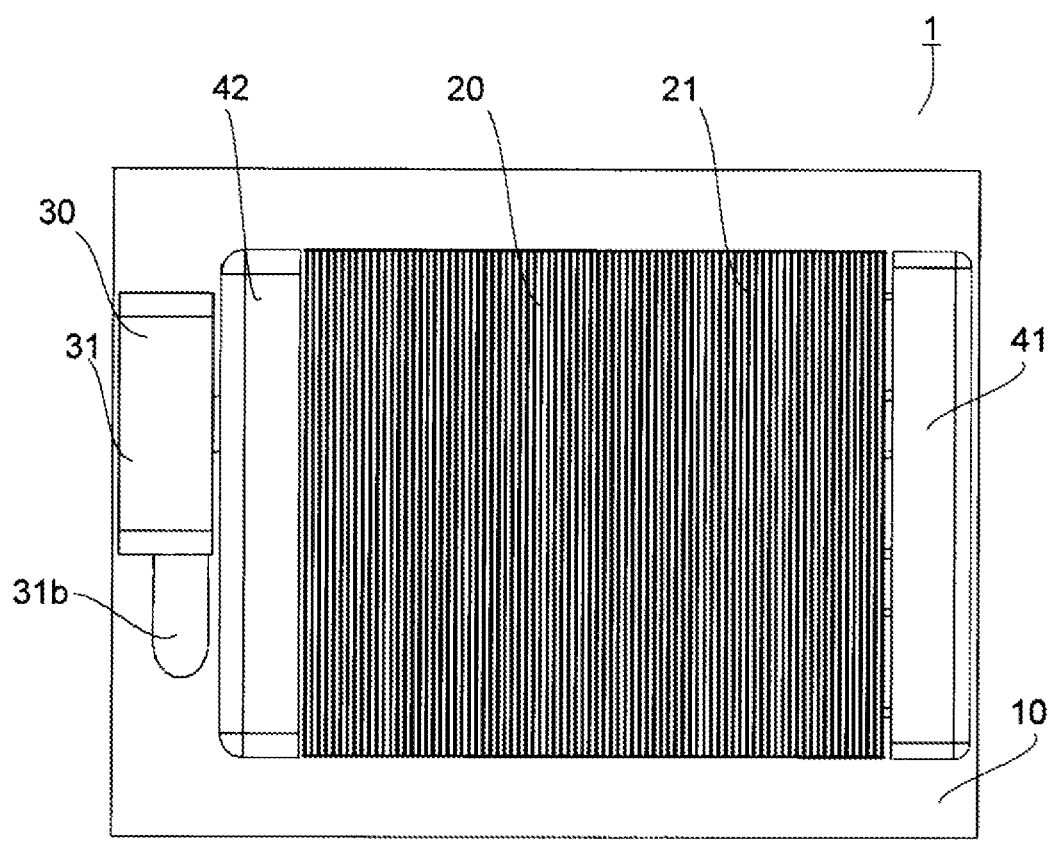
FIG. 8 is a top view of a cooling apparatus according to a second example embodiment of the present disclosure.

Next, a second preferred embodiment of the present disclosure will now be described below. FIG. 8 is a top view of a cooling apparatus 1 according to the second preferred embodiment. For the sake of convenience in description, members or portions that have their equivalents in the above-described first preferred embodiment illustrated in FIGS. 1 to 7 are denoted by the same reference numerals as those of their equivalents in the first preferred embodiment. In the second preferred embodiment, a pump 30 is arranged on a cold plate 10.

The cold plate 10 is rectangular in a plan view, and a first coolant passage 11 is in the shape of a rectangular parallelepiped. Thus, an increase in the capacity of the first coolant passage 11 can be achieved while limiting an increase in the size of the cooling apparatus 1 as a whole, even with a limited space for the cooling apparatus 1. Transfer of heat to a coolant can thus be promoted to achieve an additional improvement in cooling performance of the cooling apparatus 1.

Figure 9:
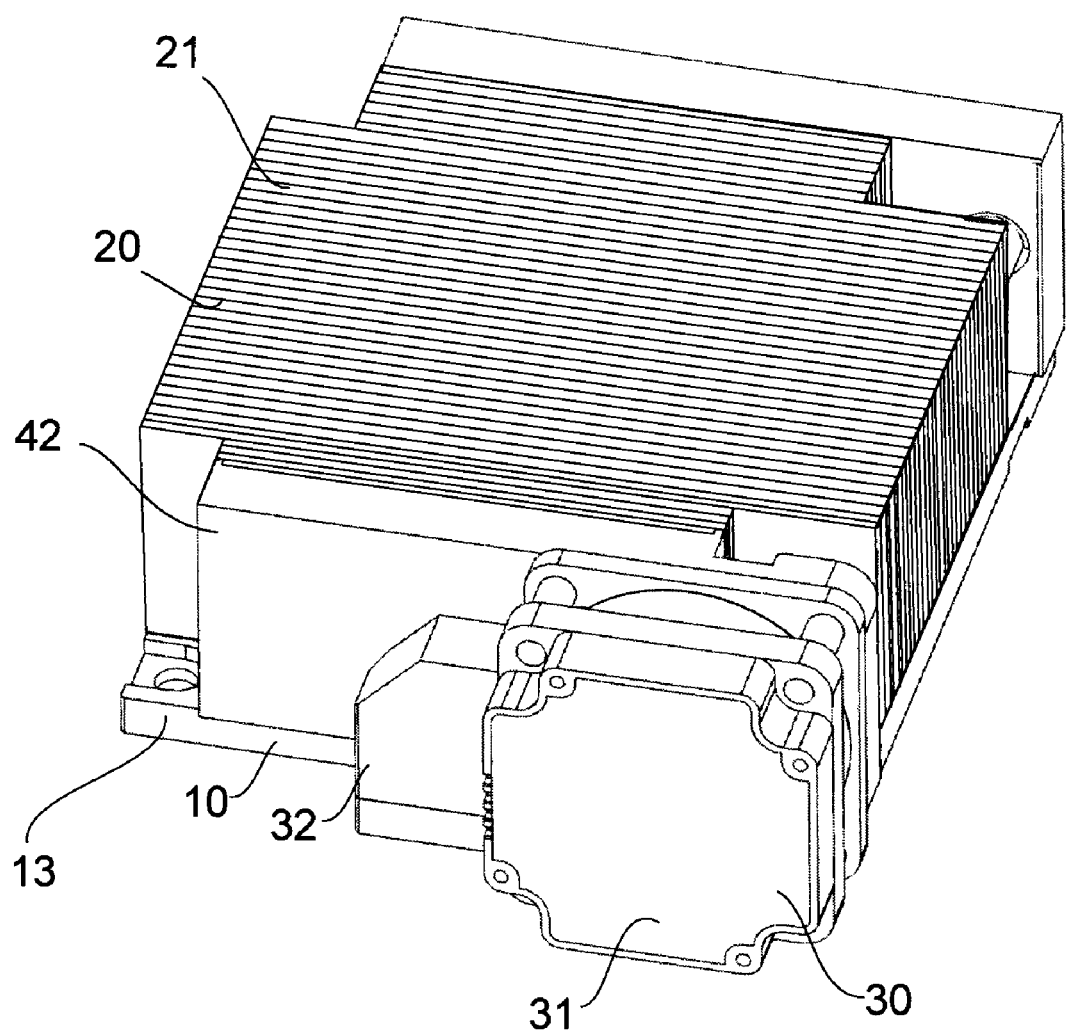
FIG. 9 is a top perspective view of a cooling apparatus according to a third example embodiment of the present disclosure.
Figure 10:
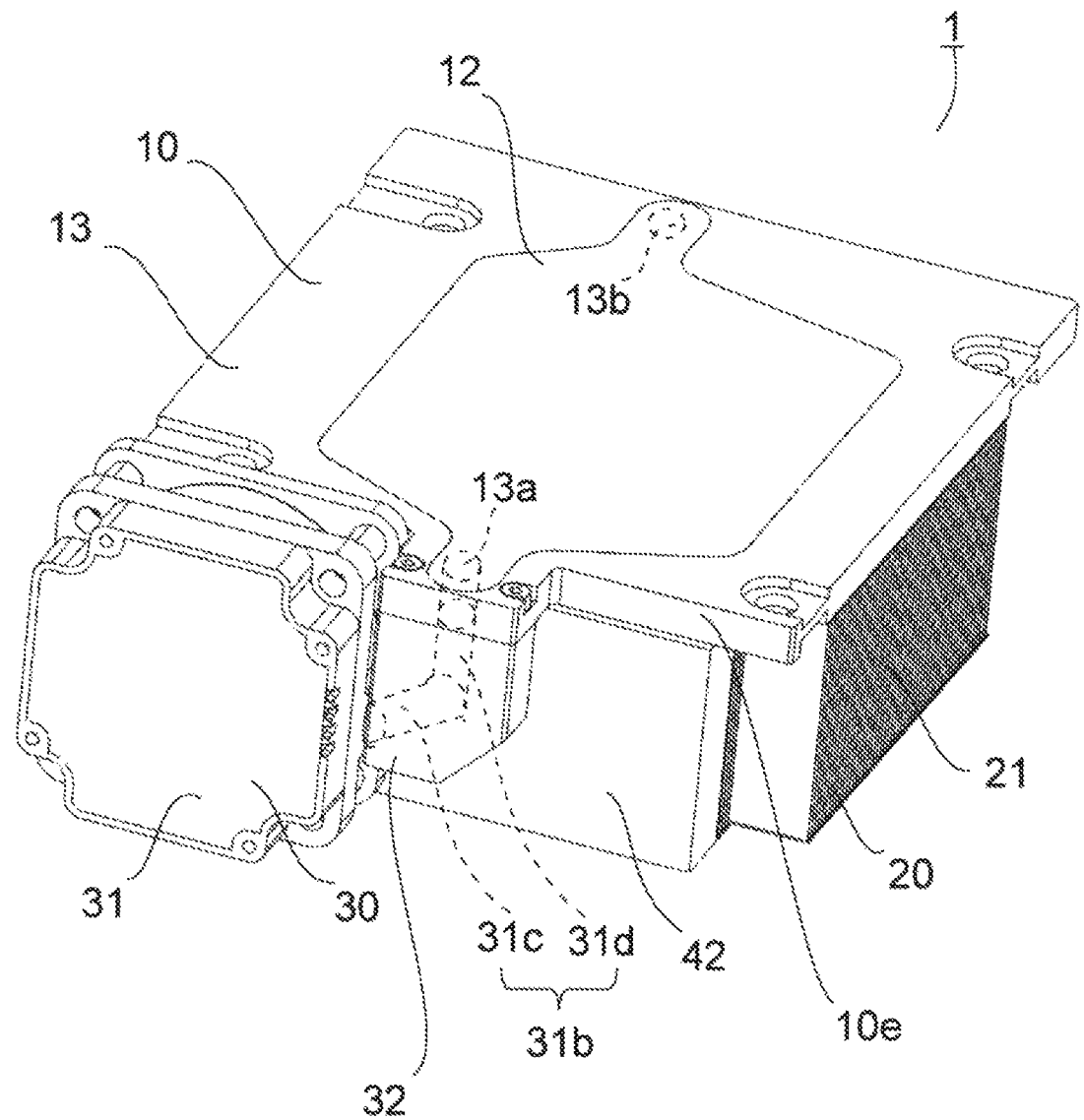
FIG. 10 is a bottom perspective view of the cooling apparatus according to the third example embodiment of the present disclosure.
Figure 11:
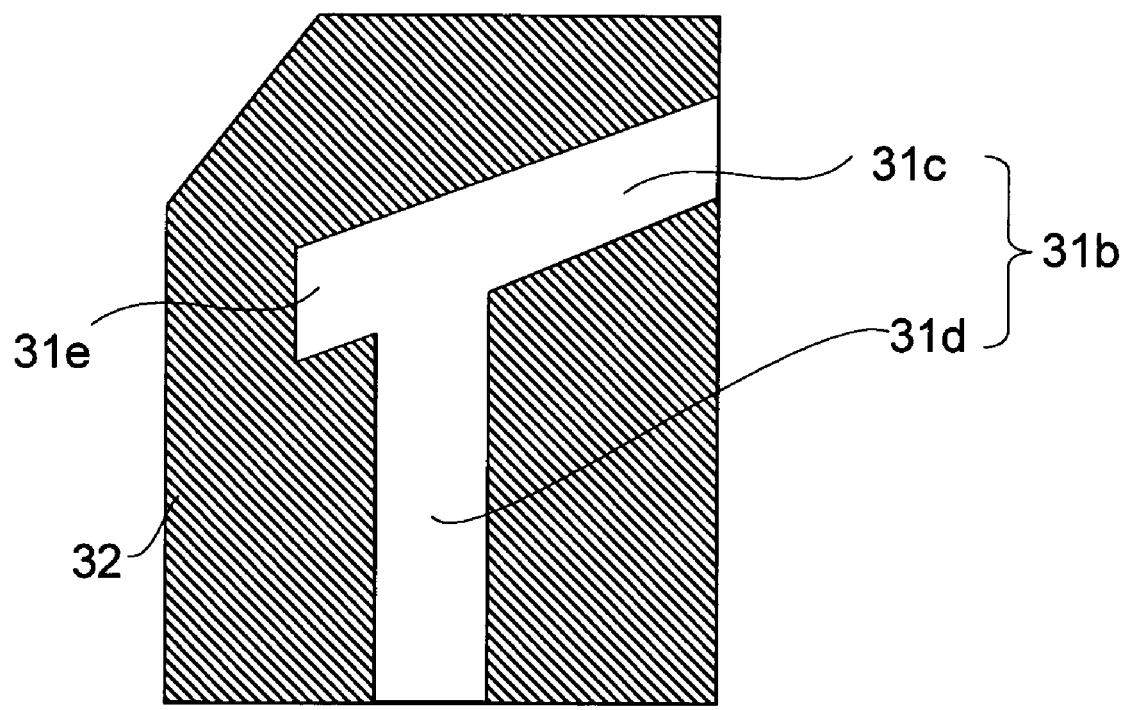
FIG. 11 is a vertical sectional view illustrating a discharge outlet of the cooling apparatus according to the third example embodiment of the present disclosure.
Figure 1:
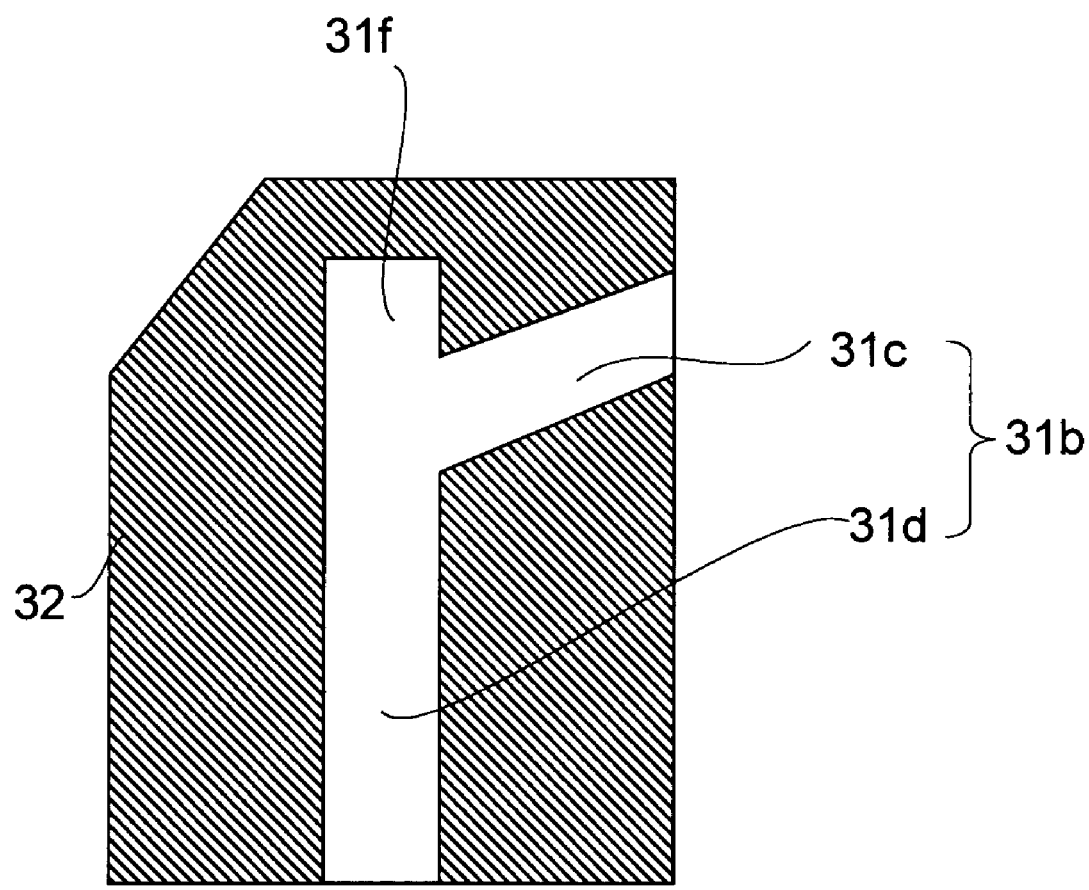

Next, a third preferred embodiment of the present disclosure will now be described below. FIGS. 9 and 10 are a top perspective view and a bottom perspective view, respectively, of a cooling apparatus 1 according to the third preferred embodiment. FIG. 11 is a vertical sectional view illustrating a discharge outlet 31b of the cooling apparatus 1 in an enlarged form. For the sake of convenience in description, members or portions that have their equivalents in the above-described first preferred embodiment illustrated in FIGS. 1 to 7 are denoted by the same reference numerals as those of their equivalents in the first preferred embodiment. The third preferred embodiment is different from the first preferred embodiment in the shape of the discharge outlet 31b.

A cold plate 10 includes cut portions 10d and 10e defined by bends of both end portions of a short-side side surface of the cold plate 10 in a plan view. At least a portion of a pump 30 is arranged at the cut portion 10d and opposite to the side surface of the cold plate 10. In addition, an inflow port 13a is arranged between the cut portions 10d and 10e.

The cooling apparatus 1 further includes a discharge portion 32. The discharge portion 32 is a member made of a metal, and fixed onto the cold plate 10 through screws. The discharge portion 32 includes the discharge outlet 31b. The discharge outlet 31b is defined by subjecting the discharge portion 32 to a cutting process. That is, the discharge portion 32, including the discharge outlet 31b, and a casing 31 are defined by separate members. A pipe (not shown), which is arranged to be in communication with a passage in the casing 31 and is arranged to project from a side surface of the casing 31, is inserted into the discharge outlet 31b. The casing 31 and the discharge portion 32 are thus joined to each other, so that the passage in the casing 31 is in communication with the inflow port 13a through the discharge outlet 31b.

The discharge outlet 31b includes an outwardly extending portion 31c and a downwardly extending portion 31d. The outwardly extending portion 31c is arranged to extend outward from the side surface of the casing 31 while slanting downward with increasing distance from the casing 31. The downwardly extending portion 31d is arranged to extend downward from a distal end of the outwardly extending portion 31c. This arrangement contributes to reducing the dimension of the discharge outlet 31b measured in the widthwise direction Y, and thus reducing the size of the cooling apparatus 1 as a whole.

In addition, when the discharge portion 32 and the casing 31 are defined by separate members, the pump 30 and the cold plate 10 can be easily connected to each other through the discharge portion 32 even if the position of the inflow port 13a is shifted in a horizontal direction. Further, a design change in the direction in which a coolant is to be discharged from the pump 30 is not required if an appropriate design in the direction in which the discharge outlet 31b extends is made. This leads to a reduced production cost of the cooling apparatus 1. Note that, although the outwardly extending portion 31c is arranged to slant downward with increasing distance from the casing 31 in the present preferred embodiment, the outwardly extending portion 31c may alternatively be arranged to extend in the horizontal direction.

The discharge outlet 31b includes an extension portion 31e arranged to extend from the distal end of the outwardly extending portion 31c outwardly of an upper end of the downwardly extending portion 31d. Provision of the extension portion 31e makes it easier to connect the outwardly extending portion 31c and the downwardly extending portion 31d to each other when the discharge portion 32 is subjected to the cutting process. Specifically, after the outwardly extending portion 31c is shaped by cutting a side surface of the discharge portion 32 using a drill or the like, the downwardly extending portion 31d is shaped by cutting a lower surface of the discharge portion 32 in an upward direction. Here, in the case where the extension portion 31e is defined when the outwardly extending portion 31c is shaped, the outwardly extending portion 31c and the downwardly extending portion 31d can be securely connected to each other without the need for a dimension adjustment even if the downwardly extending portion 31d is slightly displaced in a horizontal direction.

FIG. 12 is a vertical sectional view illustrating a discharge outlet 31b according to a modification of the third preferred embodiment of the present disclosure. As illustrated in FIG. 12, the discharge outlet 31b may include an extension portion 31f arranged to extend from an upper end of a downwardly extending portion 31d upwardly of a distal end of an outwardly extending portion 31c. In this case, after the downwardly extending portion 31d is shaped by cutting a lower surface of a discharge portion 32 in the upward direction, the outwardly extending portion 31c is shaped by cutting a side surface of the discharge portion 32 using a drill or the like. Here, in the case where the extension portion 31f is defined when the downwardly extending portion 31d is shaped, the outwardly extending portion 31c and the downwardly extending portion 31d can be securely connected to each other without the need for a dimension adjustment even if the outwardly extending portion 31c is slightly displaced in the vertical direction. Note that the discharge outlet 31b may alternatively include both the extension portions 31e and 31f.

Next, advantageous effects of the present disclosure will now be described specifically below with reference to an embodiment and comparative examples. Table 1 shows results of evaluation concerning the inclination angle of the major axis L1 of the pipe 23 with respect to the upper surface of the cold plate 10, and the cooling performance of the cooling apparatus 1.

Embodiment 1

The major axis L1 of a pipe 23 according to embodiment 1 is inclined at an angle of 10 degrees with respect to the upper surface of the cold plate 10.

Comparative Example 1

The major axis L1 of a pipe 23 according to comparative example 1 is not inclined with respect to the upper surface of the cold plate 10 (in Table 1, the inclination angle is 0 degrees).

Comparative Example 2

The major axis L1 of a pipe 23 according to comparative example 2 is inclined at an angle of 10 degrees, in an opposite direction to that of embodiment 1, with respect to the upper surface of the cold plate 10 (in Table 1, the inclination angle is −10 degrees).

(Measurements of Thermal Resistance)

Cooling apparatuses 1 according to the first preferred embodiment having the above features of embodiment 1 and comparative examples 1 and 2 were prepared, and the thermal resistances R (K/W) thereof were measured. Table 1 shows results of the measurements. Cooling air was sent in a direction (i.e., the widthwise direction Y) perpendicular to the direction in which the pipe 23 extends.

For the cooling apparatus 1 having the feature of embodiment 1, the cooling air was sent from the side on which the distance between the upper surface of the upper wall portion 13 and the major axis L1 of the pipe 23 is shorter toward the side on which this distance is longer. Meanwhile, for the cooling apparatus 1 having the feature of comparative example 2, the cooling air was sent from the side on which the distance between the upper surface of the upper wall portion 13 and the major axis L1 of the pipe 23 is longer toward the side on which this distance is shorter.

In addition, the thermal resistance R was measured with a heat source being in contact with the lower surface of the cold plate 10. The thermal resistance R is given by $R=\Delta T/\Delta Q$, where $\Delta Q$ denotes heat generated per unit time, and $\Delta T$ denotes an increase in temperature of the lower surface of the cold plate 10.

TABLE 1

| | Inclination Angle (°) | Thermal Resistance (W/K) |
|---|---|---|
| Embodiment 1 | 10 | 0.1120 |
| Comparative Example 1 | 0 | 0.1124 |
| Comparative Example 2 | −10 | 0.1127 |

(Evaluation of Cooling Performance)

It is observed from Table 1 that the thermal resistance R is lowest, meaning the highest cooling performance of the cooling apparatus 1, when the major axis L1 of the pipe 23 is inclined at an angle of 10 degrees with respect to the upper surface of the cold plate 10.

It is to be noted that the foregoing description of the preferred embodiments of the present disclosure is meant to be merely illustrative of the present disclosure. Features of the preferred embodiments may be modified appropriately without departing from the scope of the technical idea of the present disclosure. Also note that any possible combination of the preferred embodiments falls within the scope and spirit of the present disclosure.

The pump 30 according to each of the above-described preferred embodiments is a centrifugal pump. Note, however, that other types of pumps, such as, for example, a diaphragm pump or a cascade pump, may alternatively be used. Also note that the discharge outlet 31b may be defined in the casing 31, and the discharge outlet 31b and the inflow port 13a may be connected to each other. Also note that the cold plate 10 may not be rectangular in a plan view, but may alternatively be circular or in the shape of a quadrilateral such as, for example, a parallelogram in a plan view.

Cooling apparatuses according to preferred embodiments of the present disclosure can be used as, for example, cooling apparatuses to cool an electronic component, such as a microcomputer or the like.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A cooling apparatus comprising:
a cold plate including a lower surface, and a first coolant passage in which a coolant flows;
a radiator including fins to perform cooling, and a plurality of pipes each defining a second coolant passage in communication with the first coolant passage;
a pump to circulate the coolant;
a first tank joined to one end of each of the pipes; and
a second tank to join another end of each of the pipes to the pump, the pump being adjacent to the second tank; wherein
the cold plate includes:
  a first side surface extending in a first direction;
  a second side surface extending from the first side surface in a second direction which is perpendicular to the first side surface;
  a third side surface extending from the second side surface in the first direction; and
  a fourth side surface extending from the third side surface in the second direction;
the second side surface and the third side surface together define a cut portion of the cold plate;
the pump is located in the cut portion and directly opposed to both the second side surface and the third side surface in the first direction and the second direction, respectively;
the pump includes:
  an impeller rotatable about a central axis extending in a direction in which the coolant flows in the second coolant passage;
  a casing to house the impeller; and
  a discharge outlet projecting outward from a side surface of the casing to be connected to the first coolant passage; and
the discharge outlet includes an outwardly extending portion extending outward from the casing, and a downwardly extending portion extending downward from a distal end of the outwardly extending portion.

2. The cooling apparatus according to claim 1, further comprising a discharge portion including the discharge outlet,
wherein the discharge portion and the casing are defined by separate members.

3. The cooling apparatus according to claim 1, wherein the discharge outlet includes an extension portion extending from the distal end of the outwardly extending portion outwardly of an upper end of the downwardly extending portion.

4. The cooling apparatus according to claim 1, wherein the discharge outlet includes an extension portion extending from an upper end of the downwardly extending portion upwardly of the distal end of the outwardly extending portion.

5. The cooling apparatus according to claim 1, wherein each of the first tank and the second tank is provided on the cold plate.

6. The cooling apparatus according to claim 1, wherein each pipe extends in a straight line; and
the first tank and the second tank are opposite to each other in a direction in which each pipe extends.

7. The cooling apparatus according to claim 1, wherein the first tank and the second tank are arranged in parallel with a direction in which each of the fins extends.

8. The cooling apparatus according to claim 1, wherein each of the pipes is directly joined to each of the first tank and the second tank.

9. A cooling apparatus comprising:
a cold plate including:
  a top surface;
  a lower surface;
  a side surface; and
  a first coolant passage in which a coolant flows;
a pump to circulate the coolant; and
a tank; wherein
the lower surface of the cold plate is exposed to be contacted from outside the cooling apparatus;
the tank is provided on the top surface of the cold plate;
the pump is adjacent to the side surface of the cold plate and a side surface of the tank;
the pump includes an impeller rotatable about a central axis extending in a first direction; and
the pump and the tank are directly fluidly connected in the first direction.

10. The cooling apparatus according to claim 9, wherein the side surface of the cold plate includes:
a first side surface extending in the first direction;
a second side surface extending from the first side surface in a second direction perpendicular to the first direction;
a third side surface extending from the second side surface in the first direction; and
a fourth side surface extending from the third side surface in the second direction;
the second side surface and the third side surface define a cut portion of the cold plate; and
at least a portion of the pump is located in the cut portion and opposed to the second side surface and the third side surface.

11. A cooling apparatus comprising:
a cold plate including:
  a top surface;
  a lower surface; and
  a side surface;
a pump to circulate a coolant; and
a tank; wherein
the lower surface of the cold plate is exposed to be contacted from outside of the cooling apparatus;
the pump and the tank are provided on the top surface of the cold plate;
the pump and the tank are directly fluidly connected; and
the pump and the cold plate are directly fluidly connected;
the cold olate extends in a first direction;
the pump includes an impeller rotatable about a central axis extending in the first direction; and the cold plate and the pump fluidly connect in the first direction.

\* \* \* \* \*